US011210162B2

(12) United States Patent
Lin et al.

(10) Patent No.: US 11,210,162 B2
(45) Date of Patent: Dec. 28, 2021

(54) APPROACH TO IMPROVE DECOMPRESSION PERFORMANCE BY SCATTER GATHER COMPRESSION UNITS AND ALSO UPDATING CHECKSUM MECHANISM

(71) Applicant: EMC IP Holding Company LLC, Hopkinton, MA (US)

(72) Inventors: Wei Lin, Beijing (CN); Yujuan Li, Beijing (CN); Tao Chen, Beijing (CN); Yong Zou, San Jose, CA (US); Rahul Ugale, Santa Clara, CA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 27 days.

(21) Appl. No.: 16/600,391

(22) Filed: Oct. 11, 2019

(65) Prior Publication Data
US 2021/0109806 A1 Apr. 15, 2021

(51) Int. Cl.
G06F 11/10 (2006.01)
G06F 13/16 (2006.01)
H03M 7/30 (2006.01)

(52) U.S. Cl.
CPC ...... G06F 11/1004 (2013.01); G06F 13/1668 (2013.01); H03M 7/30 (2013.01)

(58) Field of Classification Search
CPC ... G06F 11/1004; G06F 13/1668; H03M 7/30
See application file for complete search history.

(56) References Cited

U.S. PATENT DOCUMENTS 10,848,179 B1* 11/2020 Li .................... G06F 9/3861
2018/0152201 A1* 5/2018 Gopal ................... G06T 1/20
2020/0162584 A1* 5/2020 Beckman ............ H04L 69/22
2020/0169268 A1* 5/2020 Billa .................. H03M 7/6011

* cited by examiner

Primary Examiner — Cynthia Britt
(74) Attorney, Agent, or Firm — Womble Bond Dickinson (US) LLP

(57) ABSTRACT

A method, apparatus, and system for decompressing data with a hardware compression/decompression accelerator is disclosed. The operations comprise: submitting compressed data from a plurality of stored compression units in a compression region to a hardware compression/decompression accelerator in a single submission for decompression, wherein each compression unit stores a checksum calculated based on corresponding uncompressed data; decompressing, at the hardware compression/decompression accelerator, the compressed data from the plurality of stored compression units, the decompressing generating combined decompressed data corresponding to the compressed data; calculating, at the hardware compression/decompression accelerator, a first combined checksum based on the combined decompressed data; calculating a second combined checksum based on individual checksums stored in the plurality of compression units; determining whether the first combined checksum matches the second combined checksum; and if the combined checksums match, forwarding the combined decompressed data to a storage device for storage as uncompressed data.

21 Claims, 7 Drawing Sheets

APPROACH TO IMPROVE DECOMPRESSION PERFORMANCE BY SCATTER GATHER COMPRESSION UNITS AND ALSO UPDATING CHECKSUM MECHANISM

FIELD OF THE INVENTION

Embodiments of the present invention relate generally to data storage systems. More particularly, embodiments of the invention relate to compression and decompression with a hardware accelerator in a data storage system.

BACKGROUND

Intel QuickAssist Technology (QAT) provides security and compression acceleration capabilities to improve performance and efficiency on computing platforms. In particular, a dedicated hardware cryptography/compression accelerator chip, which may be referred to hereinafter as the (Intel) QAT hardware accelerator, is provided. Compute-intensive security and compression operations, such as symmetric cryptography functions, asymmetric cryptography functions, and compression and decompression functions, can be offloaded from the main processor(s) (e.g., the central processing unit "CPU") to the QAT hardware accelerator.

When decompressing data with the QAT hardware accelerator, it is preferable to submit the compressed data in larger rather than smaller data packets for decompression if the total amount of data to decompress is the same, because the QAT accelerator operates on a peripheral component interconnect express (PCIe) bus, and each separate submission to the QAT accelerator incurs overhead associated with both software stack execution and data transfer over the PCIe bus.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
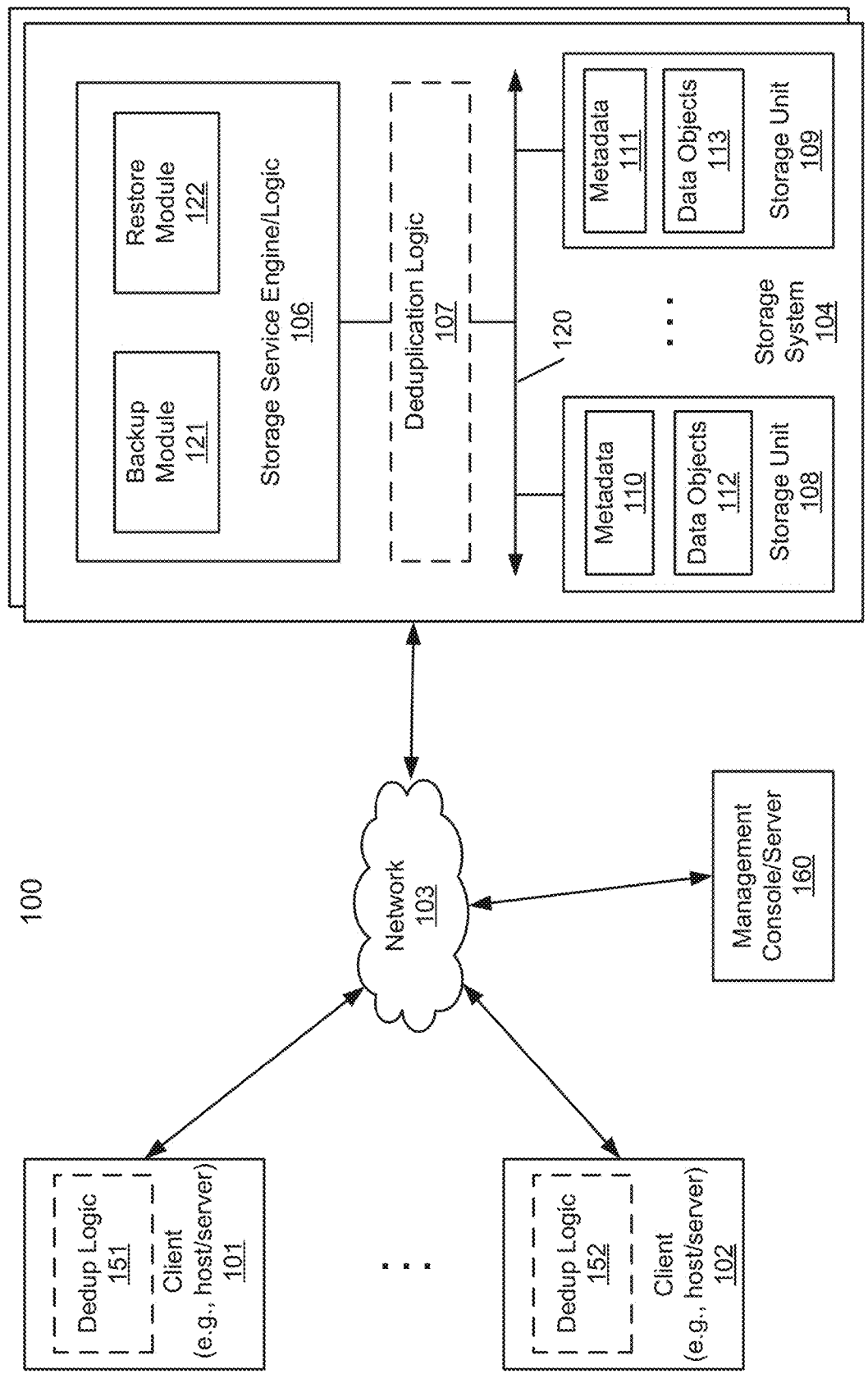
FIG. 1 is a block diagram illustrating a storage system according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

When decompressing data with the QAT hardware accelerator, it is preferable to submit the compressed data in larger rather than smaller data packets for decompression if the total amount of data to decompress is the same, because the QAT hardware accelerator operates on a peripheral component interconnect express (PCIe) bus, and each separate submission to the QAT hardware accelerator incurs overhead associated with both software stack execution and data transfer over the PCIe bus.

Presently, each compression unit stores a piece of compressed data and an Adler-32 checksum generated based on the corresponding uncompressed data. During decompression, another Adler-32 checksum is generated based on the decompressed data, and a verification process is performed based on a comparison of the checksum generated from the decompressed data against the stored checksum. As a result, compression units need to be individually submitted to the QAT hardware accelerator for decompression and compressed data from more than one compression units in a compression region cannot be submitted to the QAT hardware accelerator in a single submission for decompression because a combined Adler-32 checksum corresponding to the combined uncompressed data cannot be generated from individual Adler-32 checksums corresponding to the individual pieces of uncompressed data, and therefore a combined checksum is not available to verify the combined decompressed data.

A method, apparatus, and system for decompressing data with a hardware compression/decompression accelerator (e.g., the QAT hardware accelerator) is disclosed. Compressed data from a plurality of stored compression units in a compression region is submitted to the hardware compression/decompression accelerator in a single submission for decompression. Each compression unit stores a checksum calculated based on corresponding uncompressed data. The compressed data from the plurality of stored compression units is decompressed at the hardware compression/decompression accelerator. The decompressing process generates combined decompressed data corresponding to the compressed data from the plurality of stored compression units. A first combined checksum is calculated at the hardware compression/decompression accelerator based on the combined decompressed data. A second combined checksum is calculated based on individual checksums stored in the plurality of compression units. Whether the first combined checksum matches the second combined checksum is determined. Thereafter, in response to determining that the first combined checksum matches the second combined checksum, the combined decompressed data is forwarded to a storage device for storage as uncompressed data.

In one embodiment, on the other hand, in response to determining that the first combined checksum does not match the second combined checksum, the combined decompressed data is invalidated. The decompression process may be restarted.

In one embodiment, the individual checksums stored in the plurality of compression units, the first combined checksum, and the second combined checksum are cyclic redundancy check 32 (CRC32) checksums.

In one embodiment, the compressed data from the plurality of stored compression units are submitted to the hardware compression/decompression accelerator in a scatter gather list.

In one embodiment, each compression unit stores a header comprising an offset indicative of a location of a beginning of a next compression unit in the compression region. The offsets comprised in the headers from the plurality of compression units are utilized to locate the compressed data from the plurality of compression units without sequentially searching through the compression region when the compressed data are submitted for decompression.

In one embodiment, compressed data from all stored compression units in the compression region is submitted to the hardware compression/decompression accelerator for decompression in the single submission.

FIG. 1 is a block diagram illustrating a storage system according to one embodiment of the invention. Referring to FIG. 1, system 100 includes, but is not limited to, one or more client systems 101-102 communicatively coupled to storage system 104 over network 103. Clients 101-102 may be any type of clients such as a host or server, a personal computer (e.g., desktops, laptops, and tablets), a "thin" client, a personal digital assistant (PDA), a Web enabled appliance, or a mobile phone (e.g., Smartphone), etc. Alternatively, any of clients 101-102 may be a primary storage system (e.g., local data center) that provides storage to other local clients, which may periodically back up the content stored therein to a backup storage system (e.g., a disaster recovery site or system), such as storage system 104. Network 103 may be any type of networks such as a local area network (LAN), a wide area network (WAN) such as the Internet, a fiber network, a storage network, or a combination thereof, wired or wireless. Clients 101-102 may be in physical proximity or may be physically remote from one another. Storage system 104 may be located in proximity to one, both, or neither of clients 101-102.

Storage system 104 may include or represent any type of servers or a cluster of one or more servers (e.g., cloud servers). For example, storage system 104 may be a storage server used for various different purposes, such as to provide multiple users or client systems with access to shared data and/or to back up (or restore) data (e.g., mission critical data). Storage system 104 may provide storage services to clients or users via a variety of access interfaces and/or protocols such as file-based access protocols and block-based access protocols. The file-based access protocols may include the network file system (NFS) protocol, common Internet file system (CIFS) protocol, and direct access file system protocol, etc. The block-based access protocols may include the small computer system interface (SCSI) protocols, Internet SCSI or iSCSI, and Fibre channel (FC) protocol, etc. Storage system 104 may further provide storage services via an object-based protocol and Hadoop distributed file system (HDFS) protocol.

In one embodiment, storage system 104 includes, but is not limited to, storage service engine 106 (also referred to as service logic, service module, or service unit, which may be implemented in software, hardware, or a combination thereof), optional deduplication logic 107, and one or more storage units or devices 108-109 communicatively coupled to each other. Storage service engine 106 may represent any storage service related components configured or adapted to provide storage services (e.g., storage as a service) to a variety of clients using any of the access protocols set forth above. For example, storage service engine 106 may include backup logic 121 and restore logic 122. Backup logic 121 is configured to receive and back up data from a client (e.g., clients 101-102) and to store the backup data in any one or more of storage units 108-109. Restore logic 122 is configured to retrieve and restore backup data from any one or more of storage units 108-109 back to a client (e.g., clients 101-102).

Storage units 108-109 may be implemented locally (e.g., single node operating environment) or remotely (e.g., multi-node operating environment) via interconnect 120, which may be a bus and/or a network (e.g., a storage network or a network similar to network 103). Storage units 108-109 may include a single storage device such as a hard disk, a tape drive, a semiconductor memory, multiple storage devices such as a redundant array system (e.g., a redundant array of independent disks (RAID)), a system for storage such as a library system or network attached storage system, or any other appropriate storage device or system. Some of storage units 108-109 may be located locally or remotely accessible over a network.

In response to a data file to be stored in storage units 108-109, according to one embodiment, deduplication logic 107 is configured to segment the data file into multiple segments (also referred to as chunks) according to a variety of segmentation policies or rules. Deduplication logic 107 may choose not to store a segment in a storage unit if the segment has been previously stored in the storage unit. In the event that deduplication logic 107 chooses not to store the segment in the storage unit, it stores metadata enabling the reconstruction of the file using the previously stored segment. As a result, segments of data files are stored in a deduplicated manner, either within each of storage units 108-109 or across at least some of storage units 108-109. The metadata, such as metadata 110-111, may be stored in at least some of storage units 108-109, such that files can be accessed independent of another storage unit. Metadata of each storage unit includes enough information to provide access to the files it contains.

Figure 2A:
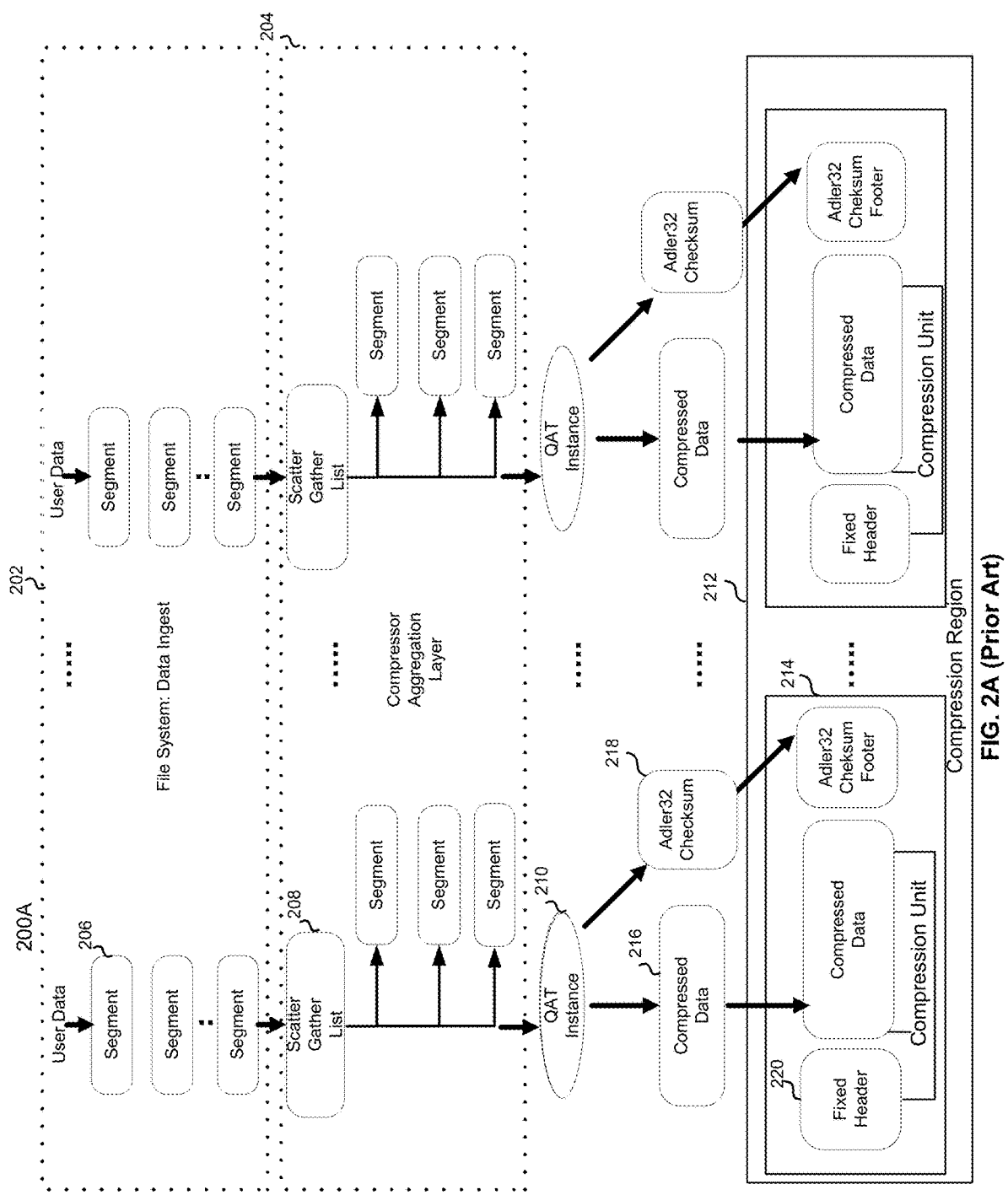
FIG. 2A is a diagram illustrating a prior art compression process.

Referring to FIG. 2A, a diagram illustrating a prior art compression process 200A is shown. Uncompressed user data comprising data segments 206 in a file system 202 is submitted to a QAT hardware accelerator 210 for compression. The segments 206 are submitted to the QAT hardware accelerator 210 in a scatter gather list 208 compiled in a compression aggregation layer 204. The QAT hardware accelerator 210 performs a compression process and generates compressed data 216 based on the uncompressed segments 206 in the present submission. Further, the QAT hardware accelerator 210 also generates an Adler-32 checksum 218 based on the same uncompressed segments 206. Accordingly, when the compressed data 216 is decompressed, the Adler-32 checksum 218 can be used to verify whether the decompression has been correctly executed. The compressed data 216 and the Adler-32 checksum 218 are stored in a compression unit 214 in a compression region 212. The compression region 212 comprises a plurality of compression units 214. A header 220 with a predetermined fixed size and content is placed at the beginning of each compression unit 214, so that individual compression units 214 can be identified when the compression region 212 is sequentially searched through.

Figure 2B:
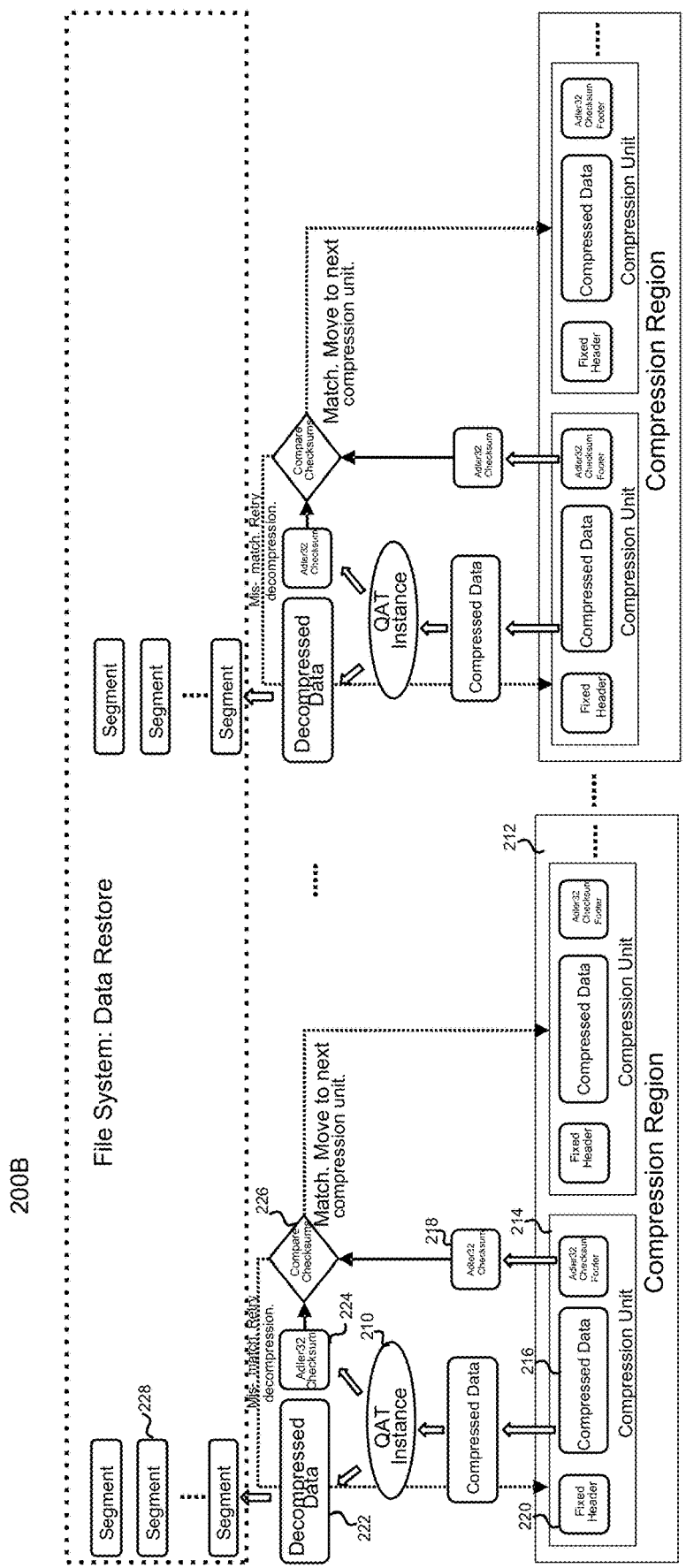
FIG. 2B is a diagram illustrating a prior art decompression process.

Referring to FIG. 2B, a diagram illustrating a prior art decompression process 200B is shown. The compression units 214 are decompressed at the QAT hardware accelerator 210 individually, one at a time. The compressed data 216 is submitted to the QAT hardware accelerator 210 for decompression. The QAT hardware accelerator 210 decompresses the compressed data 216 and accordingly generates decompressed data 222. The QAT hardware accelerator 210 then calculates an Adler-32 checksum 224 based on the decompressed data 222. The calculated Adler-32 checksum 224 is compared against the stored Adler-32 checksum 218 to verify whether the decompression has been correctly executed. If the Adler-32 checksums 224, 218 match, the decompressed data 222 can be considered as verified correct data, and is forwarded to the file system 202 for storage as uncompressed data segments 228.

As described above, when decompressing data with the QAT hardware accelerator 210, it is preferable to submit the compressed data in larger rather than smaller data packets for decompression if the total amount of data to decompress is the same. However, as a combined Adler-32 checksum corresponding to combined uncompressed data cannot be generated from individual Adler-32 checksums corresponding to the individual pieces of uncompressed data, compression units 214 need to be individually submitted to the QAT hardware accelerator 210 for decompression and compressed data from more than one compression units 214 in a compression region 212 cannot be submitted to the QAT hardware accelerator 210 in a single submission for decompression because otherwise a combined checksum would not be available to verify the combined decompressed data. As a result, optimal decompression performance at the QAT hardware accelerator 210 cannot be achieved.

Figure 3A:
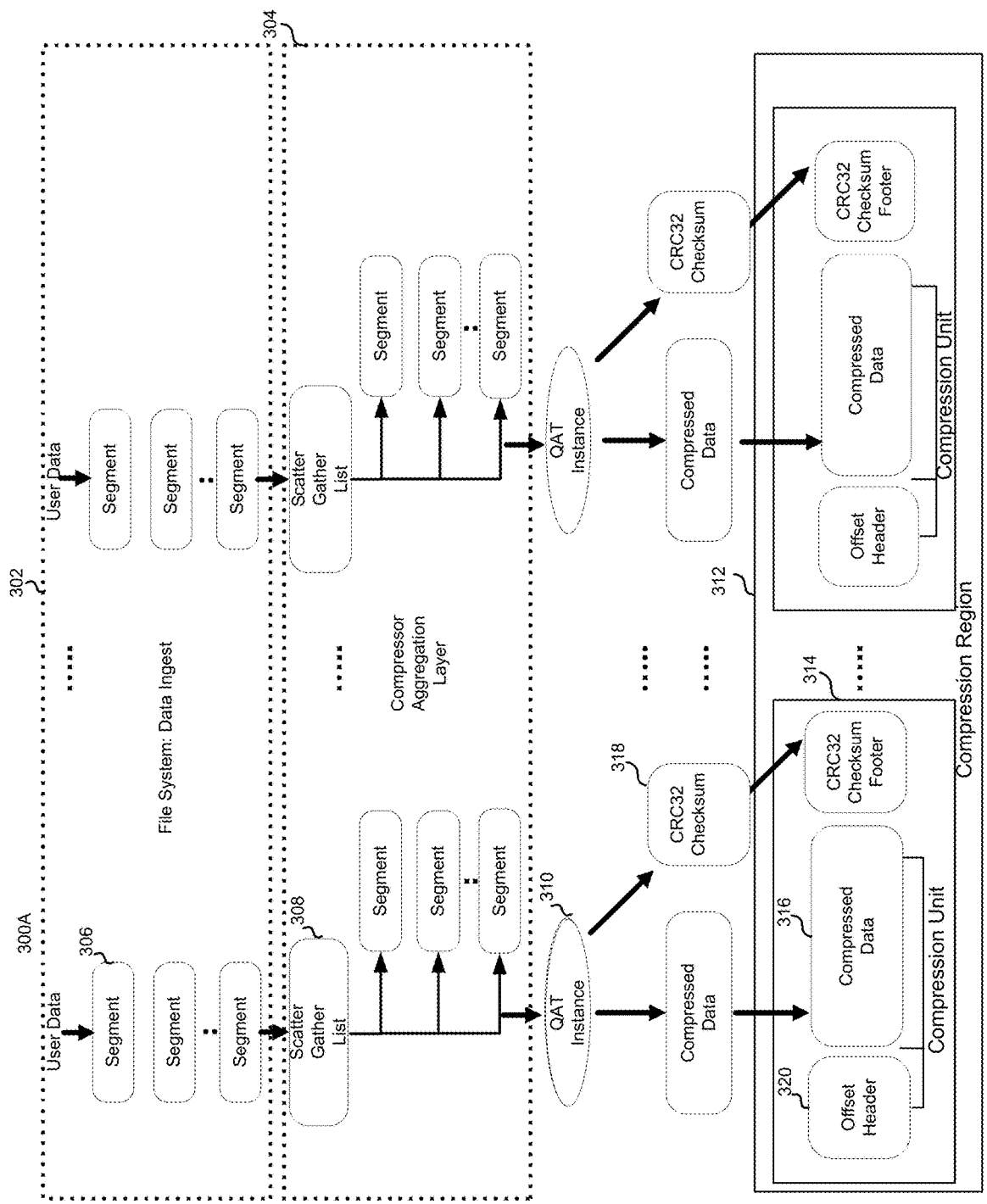
FIG. 3A is a diagram illustrating a compression process according to one embodiment.

Referring to FIG. 3A, a diagram illustrating a compression process 300A according to one embodiment is shown. Uncompressed user data comprising data segments 306 in a file system 302 is submitted to a QAT hardware accelerator 310 for compression. The segments 206 are submitted to the QAT hardware accelerator 210 in a scatter gather list 308 compiled in a compression aggregation layer 304. The QAT hardware accelerator 310 performs a compression process and generates compressed data 316 based on the uncompressed segments 306 in the present submission. Any suitable compression algorithm can be utilized, and the compression algorithm does not limit the disclosure. Further, the QAT hardware accelerator 310 also generates a CRC32 checksum 318 based on the same uncompressed segments 306. The compressed data 316 and the CRC32 checksum 318 are stored in a compression unit 314 in a compression region 312. The compression region 312 comprises a plurality of compression units 314. Further, each compression unit 314 other than the last one in the compression region 312 stores a header 320 at its beginning comprising an offset indicative of the location of the beginning of the next compression unit 314 in the compression region 312. The offsets comprised in the headers 320 can be utilized to locate the compressed data 316 from subsequent compression units 314 without the need to sequentially search through the compression region 312. As will be seen below, this feature is useful when compressed data 316 from more than one compression units 314 is to be submitted to the QAT hardware accelerator 310 for decompression in a single submission. It should be appreciated that other types of headers may also be utilized to achieve the same function. For example, a header may instead indicate the size of the present compression unit 314 or the size of the compressed data 316 in the present compression unit 314, etc.

Figure 3B:
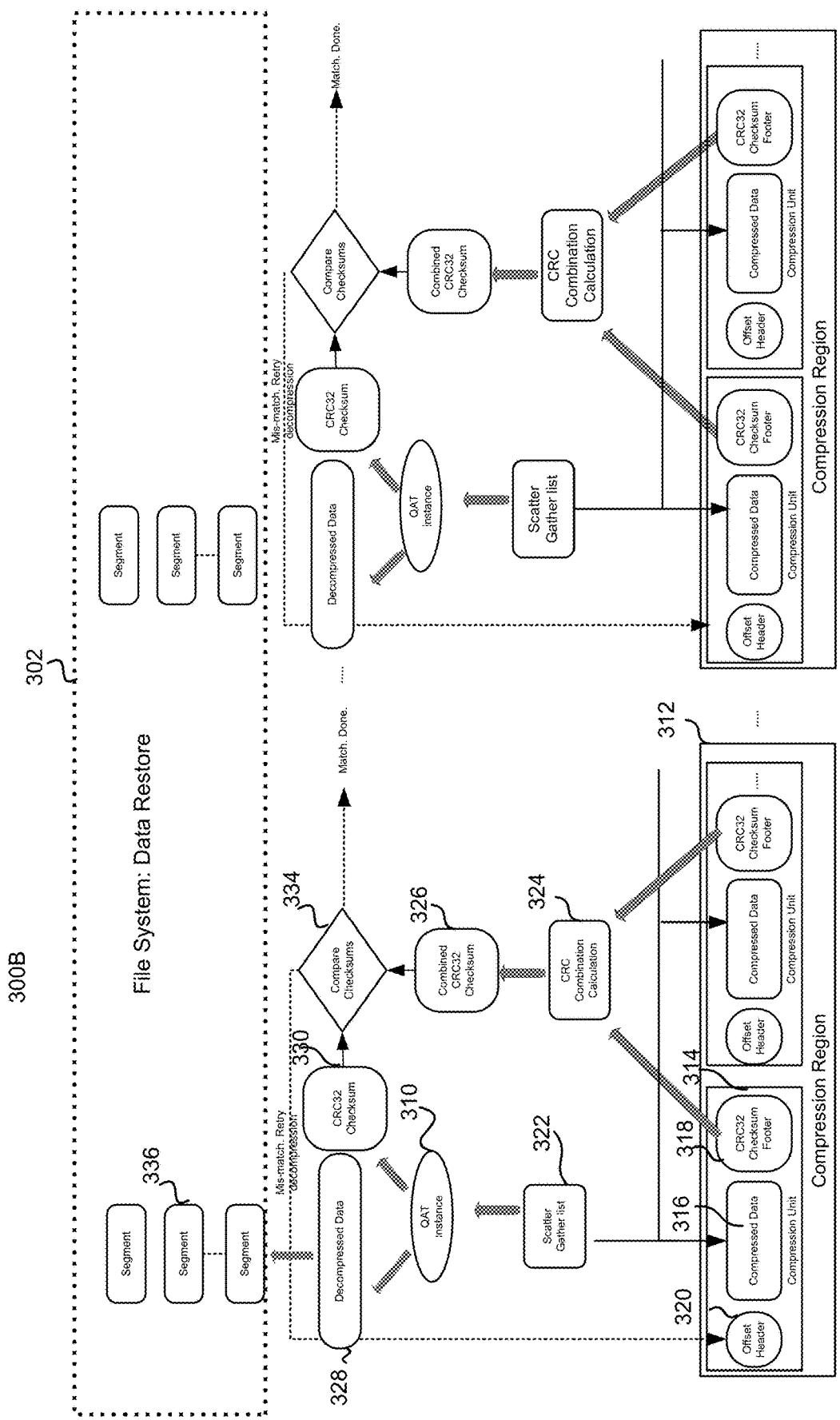
FIG. 3B is a diagram illustrating a decompression process according to one embodiment.

Referring to FIG. 3B, a diagram illustrating a decompression process 300B according to one embodiment is shown. Compressed data 316 from a plurality of compression units 314 in a compression region 312 is submitted to the QAT hardware accelerator 310 in a single submission for decompression. QAT hardware accelerator 310 decompresses the combined compressed data 316, and generates combined (e.g., concatenated) decompressed data 328 corresponding to the compressed data 316 from the plurality of stored compression units 314.

Further, a first combined CRC32 checksum 330 is calculated at the QAT hardware accelerator 310 based on the combined decompressed data 328. A second combined CRC32 checksum 326 is calculated at block 324 based on individual CRC32 checksums 318 stored in the plurality of compression units 314. In one embodiment, the second combined CRC32 checksum 326 may be calculated at a general-purpose processor, such as a central processing unit (CPU). It should be appreciated that based on the definition of CRC32 checksums, the method for calculating the second combined CRC32 checksum 326 based on the individual CRC32 checksums 318 is known to those of ordinary skill in the art. Thereafter, whether the first combined CRC checksum 330 matches the second combined checksum 326 is determined at block 334 in order to verify whether the decompression process has been correctly executed. If the combined CRC checksums 330, 326 match, the combined decompressed data 328 can be considered as verified correct data, and is forwarded to the file system 410 for storage as uncompressed segments 336. On the other hand, if the combined CRC checksums 330, 326 do not match, the combined decompressed data 328 is invalidated, and the decompression process may be restarted.

It should be appreciated that in different embodiments, other checksum algorithms than CRC32 may also be utilized, so long the checksum algorithm used allows for the calculation of the combined checksum based on the individual checksums.

In one embodiment, compressed data 316 from all stored compression units 314 in the compression region 312 is submitted to the QAT hardware accelerator 310 for decompression in a single submission.

Figure 4:
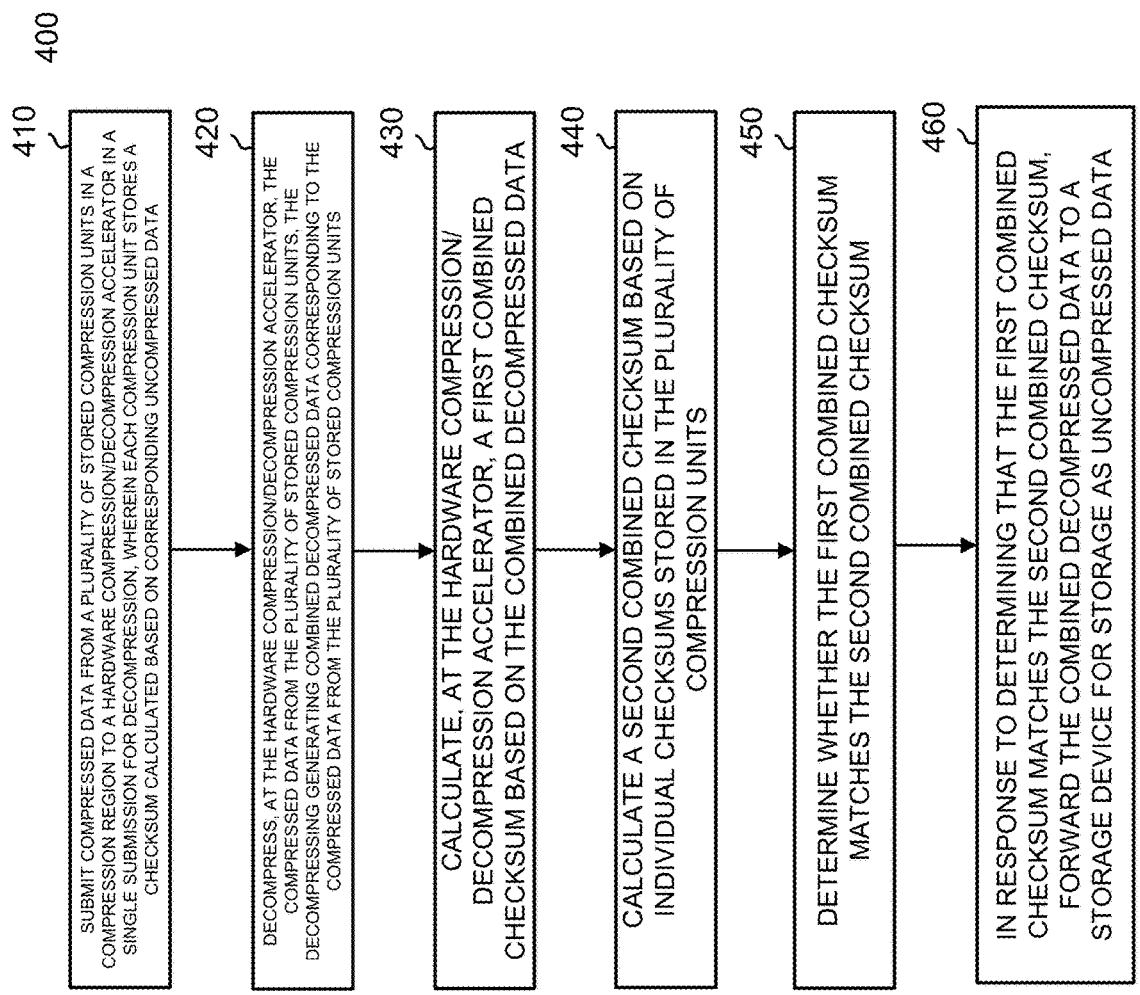
FIG. 4 is a flowchart illustrating an example method for decompressing data with a hardware compression/decompression accelerator according to one embodiment.

Referring to FIG. 4, a flowchart illustrating an example method 400 for decompress sing data with a hardware compression/decompression accelerator according to one embodiment is shown. Process 400 may be performed by processing logic that includes hardware (e.g. circuitry, dedicated logic, etc.), software (e.g., embodied on a non-transitory computer readable medium), or a combination thereof. For example, process 400 may be performed by processor 1501 of FIG. 5. Referring to FIG. 4, at block 410, compressed data from a plurality of stored compression units in a compression region is submitted to the hardware compression/decompression accelerator in a single submission for decompression. Each compression unit stores a checksum calculated based on corresponding uncompressed data. At block 420, the compressed data from the plurality of stored compression units is decompressed at the hardware compression/decompression accelerator. The decompressing process generates combined decompressed data corresponding to the compressed data from the plurality of stored compression units. At block 430, a first combined checksum is calculated at the hardware compression/decompression accelerator based on the combined decompressed data. At block 440, a second combined checksum is calculated based on individual checksums stored in the plurality of compression units. At block 450, whether the first combined checksum matches the second combined checksum is determined. Thereafter, at block 460, in response to determining that the first combined checksum matches the second combined checksum, the combined decompressed data is forwarded to a storage device for storage as uncompressed data.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Figure 5:
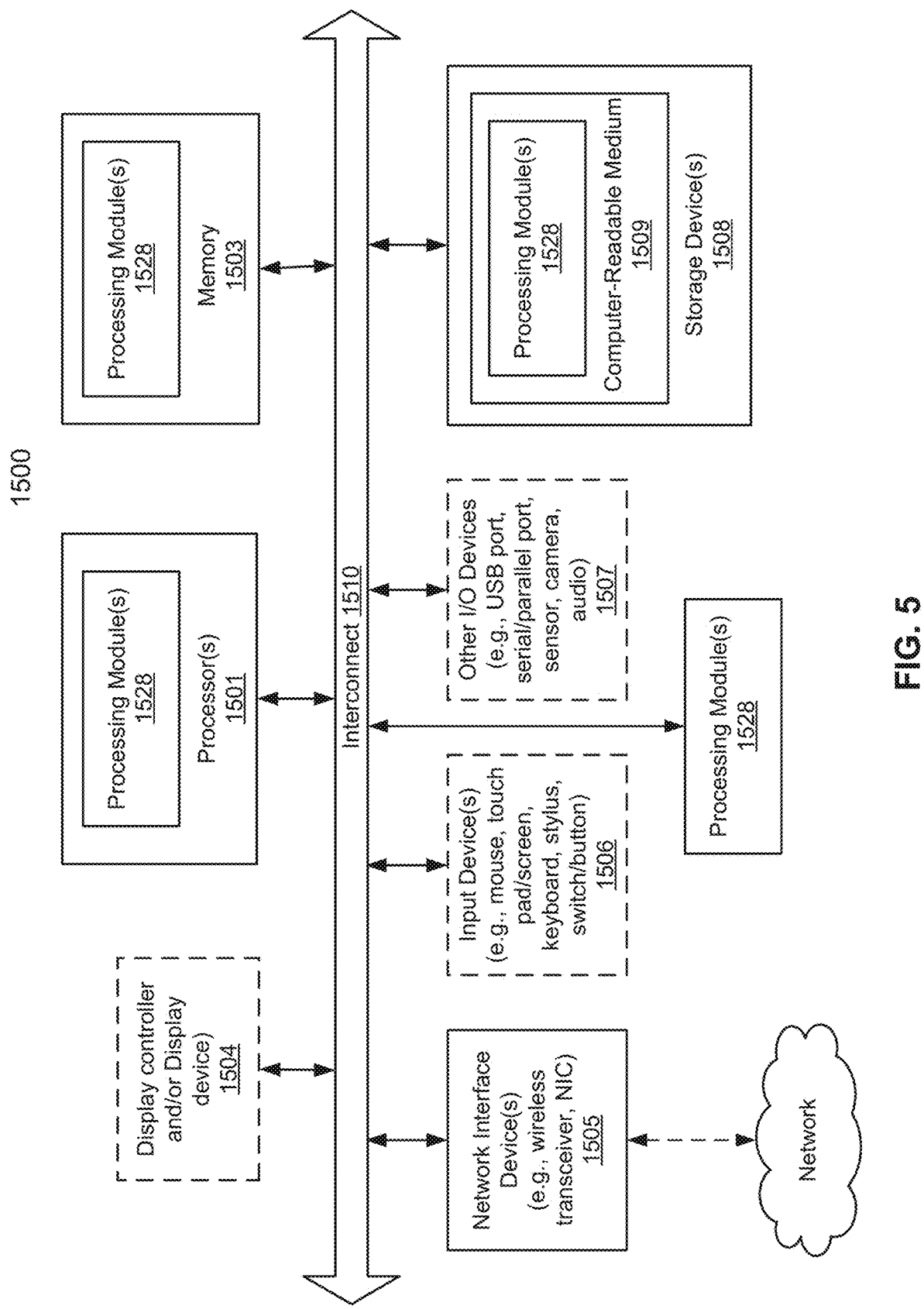
FIG. 5 is a block diagram illustrating a data processing system according to one embodiment.

FIG. 5 is a block diagram illustrating an example of a data processing system which may be used with one embodiment of the invention. For example, system 1500 may represents any of data processing systems described above performing any of the processes or methods described above. System 1500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 1500 is intended to show a high level view of many components of the computer system. However, it is to be understood that additional components may be present in certain implementations and furthermore, different arrangement of the components shown may occur in other implementations. System 1500 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 1500 includes processor 1501, memory 1503, and devices 1505-1508 via a bus or an interconnect 1510. Processor 1501 may represent a single processor or multiple processors with a single processor core or multiple processor cores included therein. Processor 1501 may represent one or more general-purpose processors such as a microprocessor, a central processing unit (CPU), or the like. More particularly, processor 1501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 1501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 1501, which may be a low power multi-core processor socket such as an ultra-low voltage processor, may act as a main processing unit and central hub for communication with the various components of the system. Such processor can be implemented as a system on chip (SoC). Processor 1501 is configured to execute instructions for performing the operations and steps discussed herein. System 1500 may further include a graphics interface that communicates with optional graphics subsystem 1504, which may include a display controller, a graphics processor, and/or a display device.

Processor 1501 may communicate with memory 1503, which in one embodiment can be implemented via multiple memory devices to provide for a given amount of system memory. Memory 1503 may include one or more volatile storage (or memory) devices such as random access memory (RAM), dynamic RAM (DRAM), synchronous DRAM (SDRAM), static RAM (SRAM), or other types of storage devices. Memory 1503 may store information including sequences of instructions that are executed by processor 1501, or any other device. For example, executable code and/or data of a variety of operating systems, device drivers, firmware (e.g., input output basic system or BIOS), and/or applications can be loaded in memory 1503 and executed by processor 1501. An operating system can be any kind of operating systems, such as, for example, Windows® operating system from Microsoft®, Mac OS/iOS from Apple, Android® from Google®, Linux®, Unix®, or other real-time or embedded operating systems such as VxWorks.

System 1500 may further include IO devices such as devices 1505-1508, including network interface device(s) 1505, optional input device(s) 1506, and other optional IO device(s) 1507. Network interface device 1505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 1506 may include a mouse, a touch pad, a touch sensitive screen (which may be integrated with display device 1504), a pointer device such as a stylus, and/or a keyboard (e.g., physical keyboard or a virtual keyboard displayed as part of a touch sensitive screen). For example, input device 1506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 1507 may include an audio device. An audio device may include a speaker and/or a microphone to facilitate voice-enabled functions, such as voice recognition, voice replication, digital recording, and/or telephony functions. Other IO devices 1507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. Devices 1507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 1510 via a sensor hub (not shown), while other devices such as a keyboard or thermal sensor may be controlled by an embedded controller (not shown), dependent upon the specific configuration or design of system 1500.

To provide for persistent storage of information such as data, applications, one or more operating systems and so forth, a mass storage (not shown) may also couple to processor 1501. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 1501, e.g., via a serial peripheral interface (SPI). This flash device may provide for non-volatile storage of system software, including a basic input/output software (BIOS) as well as other firmware of the system.

Storage device 1508 may include computer-accessible storage medium 1509 (also known as a machine-readable storage medium or a computer-readable medium) on which is stored one or more sets of instructions or software (e.g., processing module, unit, and/or logic 1528) embodying any one or more of the methodologies or functions described herein. Processing module/unit/logic 1528 may represent any of the components described above, such as, for example, a storage service logic, a deduplication engine, a compression aggregation engine, a decompression aggregation engine, as described above. Processing module/unit/logic 1528 may also reside, completely or at least partially, within memory 1503 and/or within processor 1501 during execution thereof by data processing system 1500, memory 1503 and processor 1501 also constituting machine-accessible storage media. Processing module/unit/logic 1528 may further be transmitted or received over a network via network interface device 1505.

Computer-readable storage medium 1509 may also be used to store the some software functionalities described above persistently. While computer-readable storage medium 1509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Processing module/unit/logic 1528, components and other features described herein can be implemented as discrete hardware components or integrated in the functionality of hardware components such as ASICS, FPGAs, DSPs or similar devices. In addition, processing module/unit/logic 1528 can be implemented as firmware or functional circuitry within hardware devices. Further, processing module/unit/logic 1528 can be implemented in any combination hardware devices and software components.

Note that while system 1500 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the invention.

Therefore, embodiments of the disclosure relate to submitting compressed data from a plurality of compression units in a compression region to a QAT hardware accelerator for compression in a single submission. Due to the increased size of individual submissions, the number of submissions can be reduced, and the total overhead is accordingly reduced. Therefore, the decompression performance at the QAT hardware accelerator can be improved.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computer-implemented method, comprising:
submitting compressed data from a plurality of stored compression units in a compression region to a hardware compression/decompression accelerator in a single submission for decompression, wherein each compression unit comprises a checksum calculated based on corresponding uncompressed data;
decompressing, at the hardware compression/decompression accelerator, the compressed data from the plurality of stored compression units, the decompressing generating combined decompressed data corresponding to the compressed data from the plurality of stored compression units;
calculating, at the hardware compression/decompression accelerator, a first combined checksum based on the combined decompressed data;
calculating a second combined checksum based on individual checksums stored in the plurality of compression units;
determining whether the first combined checksum matches the second combined checksum; and
in response to determining that the first combined checksum matches the second combined checksum, forwarding the combined decompressed data to a storage device for storage as uncompressed data.

2. The method of claim 1, further comprising: in response to determining that the first combined checksum does not match the second combined checksum, invalidating the combined decompressed data.

3. The method of claim 1, wherein the individual checksums stored in the plurality of compression units, the first combined checksum, and the second combined checksum are cyclic redundancy check 32 (CRC32) checksums.

4. The method of claim 1, wherein the compressed data from the plurality of stored compression units are submitted to the hardware compression/decompression accelerator in a scatter gather list.

5. The method of claim 1, wherein each compression unit stores a header comprising an offset indicative of a location of a beginning of a next compression unit in the compression region.

6. The method of claim 5, wherein the offsets comprised in the headers from the plurality of compression units are utilized to locate the compressed data from the plurality of compression units without sequentially searching through the compression region when the compressed data are submitted for decompression.

7. The method of claim 1, wherein compressed data from all stored compression units in the compression region is submitted to the hardware compression/decompression accelerator for decompression in the single submission.

8. A non-transitory machine-readable medium having instructions stored therein, which when executed by a processor, cause the processor to perform data processing operations, the operations comprising:
submitting compressed data from a plurality of stored compression units in a compression region to a hardware compression/decompression accelerator in a single submission for decompression, wherein each compression unit comprises a checksum calculated based on corresponding uncompressed data;
decompressing, at the hardware compression/decompression accelerator, the compressed data from the plurality of stored compression units, the decompressing generating combined decompressed data corresponding to the compressed data from the plurality of stored compression units;
calculating, at the hardware compression/decompression accelerator, a first combined checksum based on the combined decompressed data;
calculating a second combined checksum based on individual checksums stored in the plurality of compression units;
determining whether the first combined checksum matches the second combined checksum; and
in response to determining that the first combined checksum matches the second combined checksum, forwarding the combined decompressed data to a storage device for storage as uncompressed data.

9. The non-transitory machine-readable medium of claim 8, the operations further comprising: in response to determining that the first combined checksum does not match the second combined checksum, invalidating the combined decompressed data.

10. The non-transitory machine-readable medium of claim 8, wherein the individual checksums stored in the plurality of compression units, the first combined checksum, and the second combined checksum are cyclic redundancy check 32 (CRC32) checksums.

11. The non-transitory machine-readable medium of claim 8, wherein the compressed data from the plurality of stored compression units are submitted to the hardware compression/decompression accelerator in a scatter gather list.

12. The non-transitory machine-readable medium of claim 8, wherein each compression unit stores a header comprising an offset indicative of a location of a beginning of a next compression unit in the compression region.

13. The non-transitory machine-readable medium of claim 12, wherein the offsets comprised in the headers from the plurality of compression units are utilized to locate the compressed data from the plurality of compression units without sequentially searching through the compression region when the compressed data are submitted for decompression.

14. The non-transitory machine-readable medium of claim 8, wherein compressed data from all stored compression units in the compression region is submitted to the hardware compression/decompression accelerator for decompression in the single submission.

15. A data processing system, comprising:
a processor; and
a memory coupled to the processor to store instructions, which when executed by the processor, cause the processor to perform data processing operations, the operations including:
submitting compressed data from a plurality of stored compression units in a compression region to a hardware compression/decompression accelerator in a single submission for decompression, wherein each compression unit stores comprises a checksum calculated based on corresponding uncompressed data;

decompressing, at the hardware compression/decompression accelerator, the compressed data from the plurality of stored compression units, the decompressing generating combined decompressed data corresponding to the compressed data from the plurality of stored compression units;

calculating, at the hardware compression/decompression accelerator, a first combined checksum based on the combined decompressed data;

calculating a second combined checksum based on individual checksums stored in the plurality of compression units;

determining whether the first combined checksum matches the second combined checksum; and in response to determining that the first combined checksum matches the second combined checksum, forwarding the combined decompressed data to a storage device for storage as uncompressed data.

16. The data processing system of claim 15, the operations further comprising: in response to determining that the first combined checksum does not match the second combined checksum, invalidating the combined decompressed data.

17. The data processing system of claim 15, wherein the individual checksums stored in the plurality of compression units, the first combined checksum, and the second combined checksum are cyclic redundancy check 32 (CRC32) checksums.

18. The data processing system of claim 15, wherein the compressed data from the plurality of stored compression units are submitted to the hardware compression/decompression accelerator in a scatter gather list.

19. The data processing system of claim 15, wherein each compression unit stores a header comprising an offset indicative of a location of a beginning of a next compression unit in the compression region.

20. The data processing system of claim 19, wherein the offsets comprised in the headers from the plurality of compression units are utilized to locate the compressed data from the plurality of compression units without sequentially searching through the compression region when the compressed data are submitted for decompression.

21. The data processing system of claim 15, wherein compressed data from all stored compression units in the compression region is submitted to the hardware compression/decompression accelerator for decompression in the single submission.

* * * * *

UNITED STATES PATENT AND TRADEMARK OFFICE
CERTIFICATE OF CORRECTION

PATENT NO. : 11,210,162 B2
APPLICATION NO. : 16/600391
DATED : December 28, 2021
INVENTOR(S) : Wei Lin et al.

It is certified that error appears in the above-identified patent and that said Letters Patent is hereby corrected as shown below:

In the Claims

In Claim 15, Column 13, Line 1, delete "unit stores comprises" and insert --unit comprises--.

Signed and Sealed this
Twelfth Day of December, 2023

Katherine Kelly Vidal
*Director of the United States Patent and Trademark Office*